United States Patent
Hsu et al.

(10) Patent No.: US 6,825,058 B2
(45) Date of Patent: Nov. 30, 2004

(54) METHODS OF FABRICATING TRENCH ISOLATED CROSS-POINT MEMORY ARRAY

(75) Inventors: Sheng Teng Hsu, Camas, WA (US); Wei Pan, Vancouver, WA (US); Wei-Wei Zhuang, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/391,290

(22) Filed: Mar. 17, 2003

(65) Prior Publication Data

US 2003/0206481 A1 Nov. 6, 2003

Related U.S. Application Data

(60) Continuation-in-part of application No. 10/345,547, filed on Jan. 15, 2003, which is a division of application No. 09/894,922, filed on Jun. 28, 2001, now Pat. No. 6,531,371.

(51) Int. Cl.[7] .............................................. H01L 21/00

(52) U.S. Cl. ..................... 438/59; 438/381; 438/390

(58) Field of Search ........................ 438/59, 238, 240, 438/381, 384, 385, 386, 390

(56) References Cited

U.S. PATENT DOCUMENTS

| | | | |
|---|---|---|---|
| 5,840,615 A | * | 11/1998 | Aoki et al. .................. 438/396 |
| 6,204,139 B1 | | 3/2001 | Liu et al. ..................... 438/385 |

OTHER PUBLICATIONS

Article entitled, "Electric–pulse–induced reversible resistance change effect in magnetoresistive films" by S.Q. Liu, N.J. Wu, and A. Ignatiev; published in Applied Physics Letters on May 8, 2000, vol. 76, num. 19, pp. 2749–2751.

* cited by examiner

Primary Examiner—Phuc T. Dang
(74) Attorney, Agent, or Firm—Matthew D. Rabdau; David C. Ripma; Joseph P. Curtin

(57) ABSTRACT

Resistive cross-point memory devices are provided, along with methods of manufacture and use. The memory devices are comprised by an active layer of resistive memory material interposed between upper electrodes and lower electrodes. A bit region located within the resistive memory material at the cross-point of an upper electrode and a lower electrode has a resistivity that can change through a range of values in response to application of one, or more, voltage pulses. Voltage pulses may be used to increase the resistivity of the bit region, decrease the resistivity of the bit region, or determine the resistivity of the bit region. A diode is formed between at the interface between the resistive memory material and the lower electrodes, which may be formed as doped regions, isolated from each other by shallow trench isolation. The resistive cross-point memory device is formed by doping lines, which are separated from each other by shallow trench isolation, within a substrate one polarity, and then doping regions of the lines the opposite polarity to form diodes. Bottom electrodes are then formed over the diodes with a layer of resistive memory material overlying the bottom electrodes. Top electrodes may then be added at an angled to form a cross-point array defined by the lines and the top electrodes.

14 Claims, 3 Drawing Sheets

METHODS OF FABRICATING TRENCH ISOLATED CROSS-POINT MEMORY ARRAY

CROSS-REFERENCE TO RELATED APPLICATIONS

This application is a continuation-in-part of application Ser. No. 10/345,547, filed Jan. 15, 2003, entitled "Electrically Programmable Resistance Cross Point Memory Structure", invented by Sheng Teng Hsu and Wei-Wei Zhuang, which is a divisional of application Ser. No. 09/894,922, filed Jun. 28, 2001, entitled "Electrically Programmable Resistance Cross Point Memory," invented by Sheng Teng Hsu, and Wei-Wei Zhuang, now U.S. Pat. No. 6,531,371, issued Mar. 11, 2003.

Application Ser. No. 10/345,547, filed Jan. 15, 2003, entitled "Electrically Programmable Resistance Cross Point Memory Structure", invented by Sheng Teng Hsu and Wei-Wei Zhuang is incorporated herein by reference.

BACKGROUND OF THE INVENTION

New materials, referred to herein as resistive memory materials, are now making it possible to produce non-volatile memory cells based on a change in resistance. Materials having a perovskite structure, among them colossal magnetoresistance (CMR) materials, are materials that have electrical resistance characteristics that can be changed by external influences.

For instance, the properties of materials having perovskite structures, especially CMR materials, can be modified by applying one or more short electrical pulses to a thin film or bulk material. The electric field strength or electric current density from the pulse, or pulses, is sufficient to switch the physical state of the materials so as to modify the properties of the material. The pulse is of low enough energy so as not to destroy, or significantly damage, the material. Multiple pulses may be applied to the material to produce incremental changes in properties of the material. One of the properties that can be changed is the resistance of the material. The change may be at least partially reversible using pulses of opposite polarity, or the same polarity but with wider width, from those used to induce the initial change.

SUMMARY OF THE INVENTION

Accordingly, a memory structure is provided, which comprises a substrate with a plurality of doped lines isolated from each other using shallow trench isolation, for example n-type bit lines isolated by oxide. Regions of the opposite dopant, for example p-type regions, are formed into the n-type bit lines to form diodes. Bottom electrodes overly the diodes. A layer of resistive memory material overlies the bottom electrodes. Top electrodes overly the resistive memory material. In a preferred embodiment, the top electrodes form a cross-point array with the doped lines, and the diodes are formed at each cross-point.

A method of manufacturing the memory structure is also provided. A substrate is provided and a doped-well, for example an n-well, is created. The doped-well is then divided into doped lines, for example n-type bit lines, by a shallow trench isolation process. The shallow trench isolation process simultaneous defines the doped lines, and isolates the doped lines from each other. Diodes are formed at what will become each cross-point of the cross-point array. The diodes are formed by doping a region of the doped lines to the opposite polarity, for example by implanting ions. Bottom electrodes are then formed over the diodes. A layer of resistive memory material is deposited over the bottom electrodes. Top electrodes are then deposited overlying the resistive memory material above the diodes such that a cross-point array is defined by the doped lines and the top electrodes, with a diode located at each cross-point. It may be possible, or even preferred, to achieve the method of manufacture in such a way the doped line, the diode formation, and the bottom electrode formation are all self aligned.

DETAILED DESCRIPTION OF THE INVENTION

Figure 1:
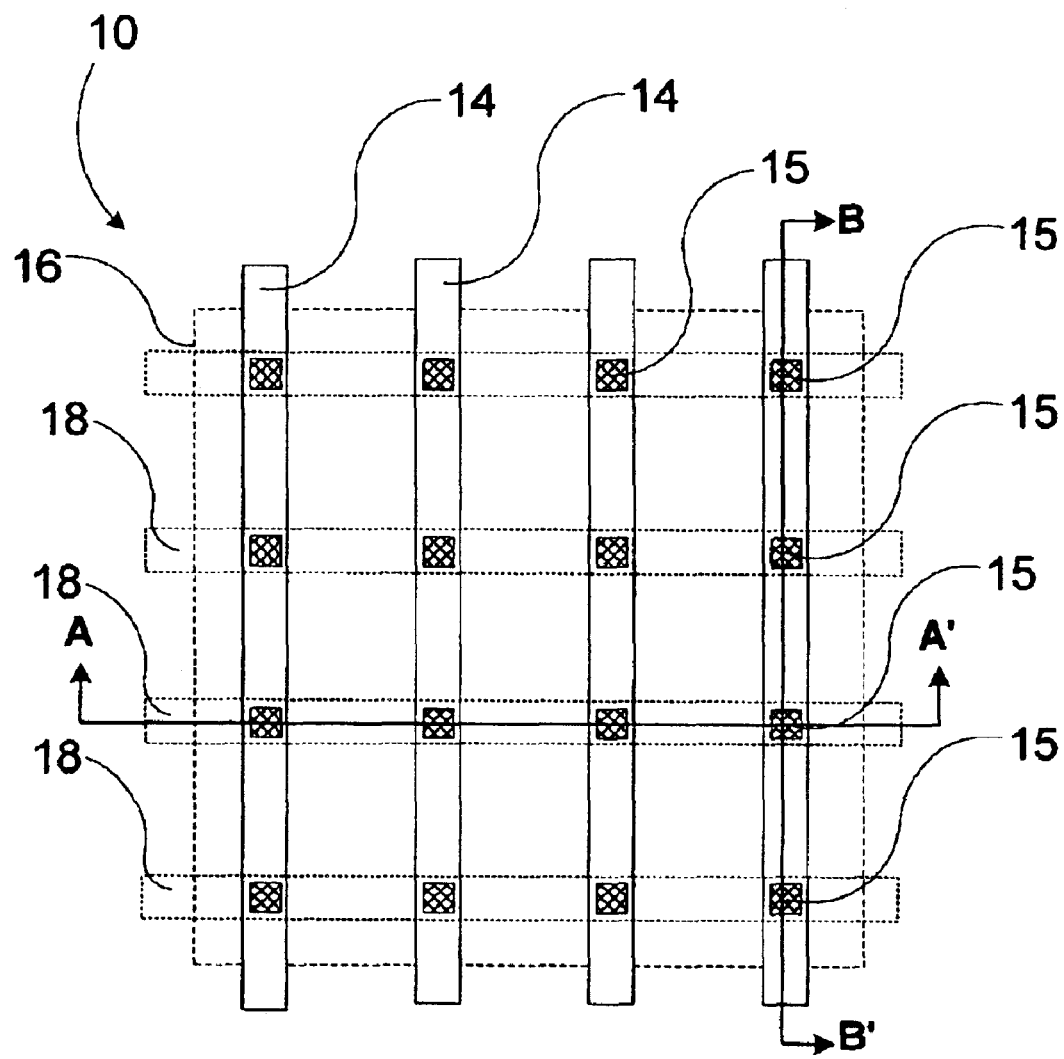
FIG. 1 is a top view on a resistive memory array.

FIG. 1 shows a cross-point memory array area 10. The memory array area 10 comprises a substrate with a plurality lines 14 formed thereon. The lines 14 may be doped lines. Diodes 15 may comprise a doped portion of the lines 14 with the opposite polarity dopants. An active layer 16 of resistive memory material overlies the plurality of lines 14. A plurality of top electrodes 18 overly the active layer 16, such that the active layer 16 is interposed between the diodes 15 and the top electrodes 18.

The top electrodes 18 and the lines 14 are each preferably substantially parallel rows. The top electrodes 18 and the lines 14 are arranged in a cross-point arrangement such that they cross each other in a regular pattern. A cross-point refers to each position where a top electrode 18 crosses a line 14. As shown, the top electrodes and the lines are arranged at substantially 90 degrees with respect to each other. The top electrodes and the lines can each function as either word lines or bit lines as part of a cross-point memory array. As shown, the lines 14 are bit lines that have been doped as n-type lines, which are also referred to as N+ bit lines.

FIG. 1 shows just the memory array area. It should be clear that in an actual device, the substrate, the lines 14 and the top electrodes 18 may extend well beyond the memory array area, which is defined by the active layer 16. In one embodiment the active layer is substantially continuous, such that the active layer extends across more than one cross-point. The lines 14 and the top electrodes 18 may connect to other support circuitry, which is not shown, on the same substrate.

FIGS. 2–9 illustrate the process for forming a resistive memory array. Those figures denoted with an A correspond to a cross-section taken along A–A' in FIG. 1. Likewise, those figures denoted with a B correspond to a cross-section taken along B–B' in FIG. 1.

Figure 2A:
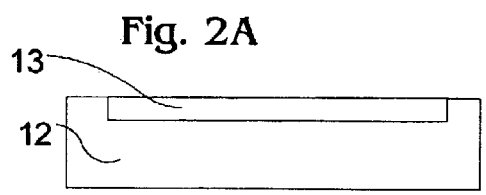
FIGS. 2A and 2B are a cross-section corresponding to A–A' and B–B' respectively in FIG. 1 during initial processing.
Figure 2B:
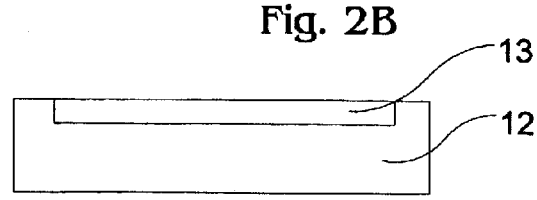

Referring now to FIGS. 2A and 2B, starting with a substrate 12, which is preferably p-type in this exemplary embodiment, form an n-well 13 to define the memory area. The substrate is any suitable substrate material, for example silicon. The n-well 20 for the memory array may be formed simultaneously with the formation of the n-wells for the supporting electronics. Supporting electronics are defined here as any non-memory devices, which may be connected to the resistive memory array, such as coding, decoding, data processing or computing circuitry. The doping density of the n-well 13 is preferably between approximately $1 \times 10^{18}/cm^2$ and $1 \times 10^{19}/cm^2$.

Figure 3A:
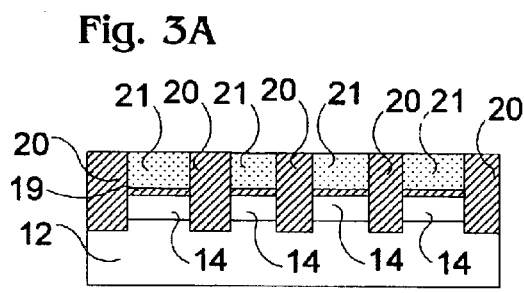
FIGS. 3A and 3B are a cross-section corresponding to A–A' and B–B' respectively in FIG. 1 during processing.
Figure 3B:
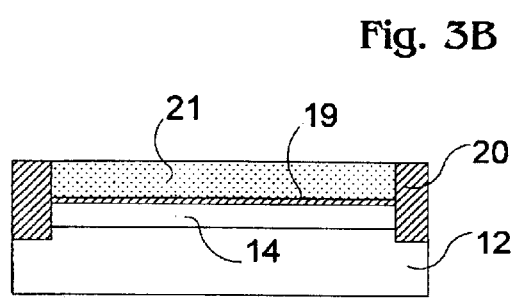

Referring now to FIGS. 3A and 3B, in one embodiment, a layer of oxide 19 and a polysilicon layer 21 is deposited and patterned to act as a mask for forming shallow trench isolation to define doped bit lines 14. The layer of oxide 19 and the polysilicon layer 21 may also be used to form the gate stacks of supporting electronics. This may allow the formation of the memory structure to be integrated efficiently into existing process flows. The layer of oxide 19 corresponds to the gate oxide of supporting electronics. The polysilicon layer 21 is preferably between approximately 100 nm and 500 nm thick. The patterning of the layer of oxide 19 and the polysilicon layer 21 may be done at the same time as the masking and etching for supporting electronics' gate stacks.

In an alternative embodiment, an additional silicon nitride layer, not shown, is deposited over the polysilicon layer 21. The silicon nitride layer may be used in cases where it is undesirable to deposit the polysilicon layer 21 to sufficient thickness, for example where the desired thickness of polysilicon layer 21 for the memory array is thicker than desired for the supporting circuitry. The silicon nitride layer can be used to make up the thickness difference and is then easily removed from the supporting electronics.

In another alternative embodiment, the polysilicon layer or silicon nitride layer may be used as a mask for shallow trench isolation without the layer of oxide 19. This alternative would be useable where the memory array is being formed using separate steps from that of the supporting electronics gate formation steps, or where a high-k dielectric material is used instead of oxide for the supporting electronics gate dielectric.

After the polysilicon layer 21, polysilicon/nitride, or other suitable patterning material is patterned, the substrate in the memory area is etched to a depth deeper than the n-well formed previously. The resulting trenches are preferably filled by depositing silicon dioxide 20 and polishing the silicon dioxide, for example using CMP, to the level of patterned polysilicon layer 22, polysilicon/nitride, or other suitable patterning material, as shown in FIGS. 3A and 3B. The resulting pattern should form parallel doped lines 14 isolated from each other.

After the shallow trench isolation is completed. The polysilicon layer 21, polysilicon/nitride stack, or other alternative patterning material is removed. At this point, the silicon dioxide or left intact.

Figure 4A:
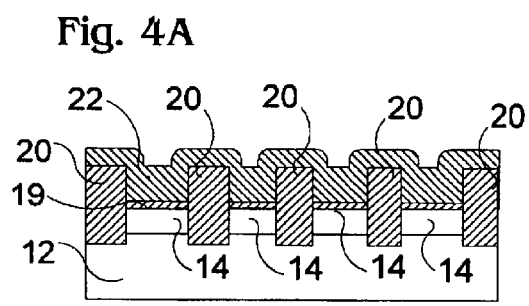
FIGS. 4A and 4B are a cross-section corresponding to A–A' and B–B' respectively in FIG. 1 during processing.
Figure 4B:
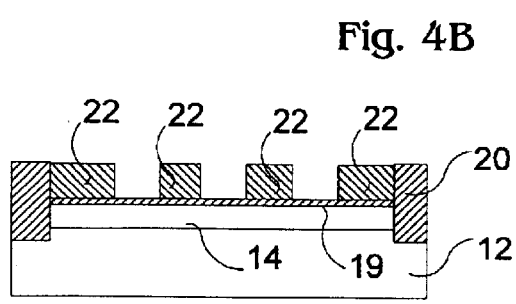

A silicon nitride layer 22 is deposited overlying the layer of oxide 20, and the n-type bit lines 14, which are n-type bit lines in the present example. The silicon nitride layer 22 is deposited to a thickness that is preferably the same as the thickness of the polysilicon layer 21, or its alternatives for example the polysilicon/nitride stack. The silicon nitride layer 22 is patterned. Preferably, the silicon nitride layer 22 will be formed as parallel lines which are perpendicular to the n-type bit lines 14, as shown in FIGS. 4A and 4B. Preferably, the memory cells will be formed in the area where the silicon nitride layer lines cover the n-type bit lines following subsequent processing.

In an alternative embodiment, polysilicon is used instead of silicon nitride to form layer 22.

In another alternative embodiment, if silicon nitride is used to form the silicon nitride layer 22, a silicidation process may be performed to form a silicide where the n-type bit lines 14 are exposed. This silicidation process may reduce the bit line resistance.

Figure 5A:
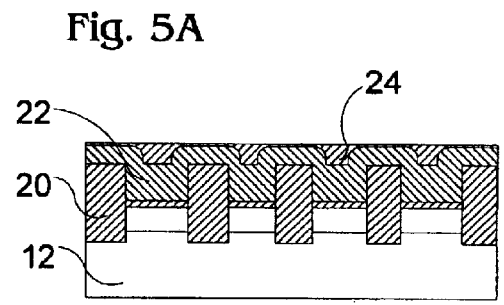
FIGS. 5A and 5B are a cross-section corresponding to A–A' and B–B' respectively in FIG. 1 during processing.
Figure 5B:
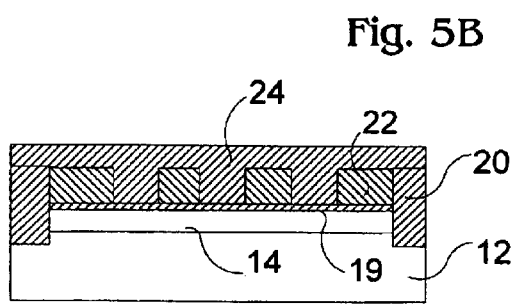

Oxide 24 is then deposited to a thickness preferably greater than one and a half times the thickness of the silicon nitride layer 22. The thickness will preferably be between approximately 200 nm and 700 nm, as shown in FIGS. 5A and 5B.

Figure 6A:
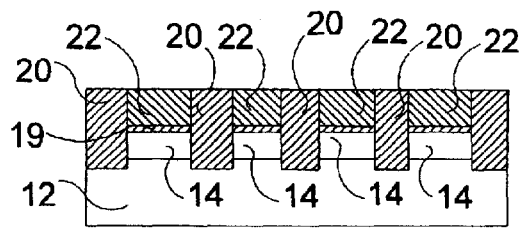
FIGS. 6A and 6B are a cross-section corresponding to A–A' and B–B' respectively in FIG. 1 during processing.
Figure 6B:
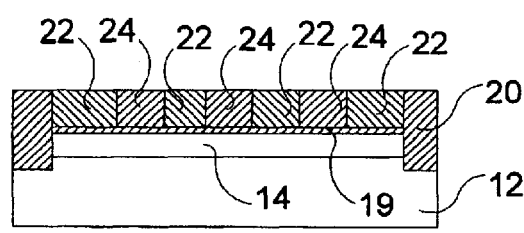

The oxide 24 and the silicon nitride layer 22 are then polished, preferably using CMP. The oxide 24 and the silicon nitride layer 22 are preferably polished to stop at the layer of oxide 20, as shown in FIGS. 6A and 6B.

Figure 7A:
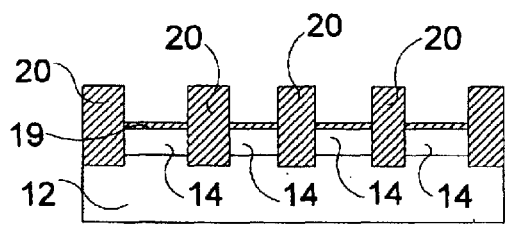
FIGS. 7A and 7B are a cross-section corresponding to A–A' and B–B' respectively in FIG. 1 during processing.
Figure 7B:
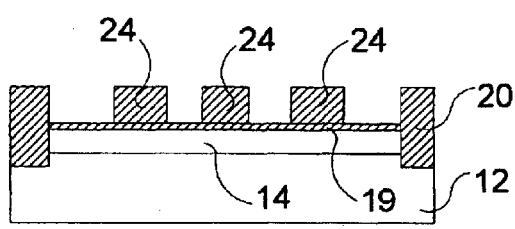

After polishing the oxide 24 and the silicon nitride layer 22, the silicon nitride layer 22 is removed, for example using a wet etch. As shown in FIGS. 7A and 7B, this will expose a region within the n-type bit lines 14.

Figure 8A:
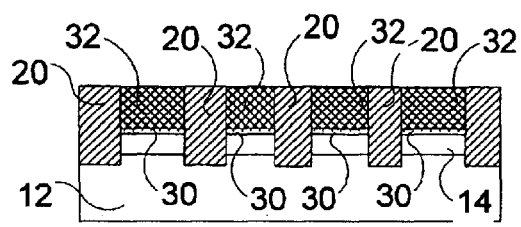
FIGS. 8A and 8B are a cross-section corresponding to A–A' and B–B' respectively in FIG. 1 during processing.
Figure 8B:
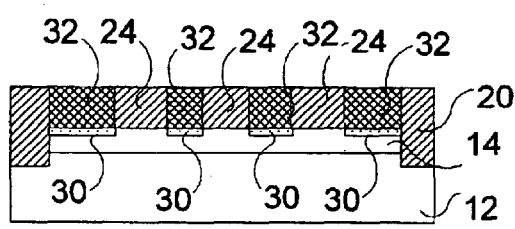

If polysilicon is used in place of silicon nitride layer 22, it would similarly be polished and removed, to produce the structure shown in FIGS. 7A and 7B, Referring now to FIGS. 8A and 8B, P+ dots 30 are formed within the exposed regions of the n-type bit lines 14. The P+ dots 30 may be formed by ion implantation forming a shallow P+ junction. In one embodiment boron ions are implanted using energies in the range of between approximately 5 keV and 15 keV at a dose of between approximately $1 \times 10^{15}/cm^2$ and $5 \times 10^{15}/cm^2$. In an alternative embodiment, $BF_2$ ions are implanted at energies between approximately 40 keV and 80 keV at a dose of between approximately $1 \times 10^{15}/cm^2$ and $5 \times 10^{15}/cm^2$. In one embodiment, the layer of oxide 19 is removed following the ion implantation. In other embodiments, the layer of oxide 19 may have been removed previously.

A bottom electrode material, such as platinum, iridium, ruthenium or other suitable material, is deposited to a thickness of between approximately 20 nm and 500 nm over the substrate 12, including the P+ dots 30. The bottom electrode material is then planarized, for example using CMP, to form the bottom electrodes 32.

In a preferred embodiment, a layer of barrier material, not shown, is deposited to a thickness of between approximately 5 nm and 20 nm prior to depositing the bottom electrode material. The barrier material is preferably TiN, TaN, WN, TiTaN or other suitable barrier material. The barrier material will also be planarized along with the bottom electrode material. The presence of the barrier material reduces, or eliminates, the formation of silicide at the interface between the bottom electrodes 32 and the P+ dots 30.

The n-type bit lines 14, the P+ dots 30 and the bottom electrodes 32 are preferably self-aligned using the process described. This self-alignment will preferably minimize the cell size of each memory cell within the memory array.

Figure 9A:
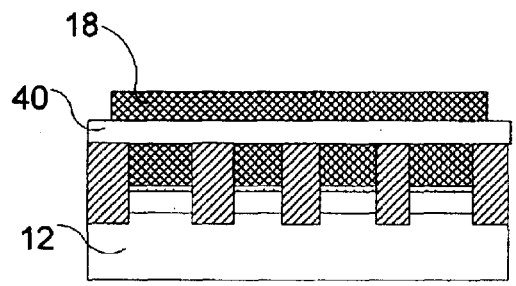
FIGS. 9A and 9B are a cross-section corresponding to A–A' and B–B' respectively in FIG. 1 as shown.
Figure 9B:
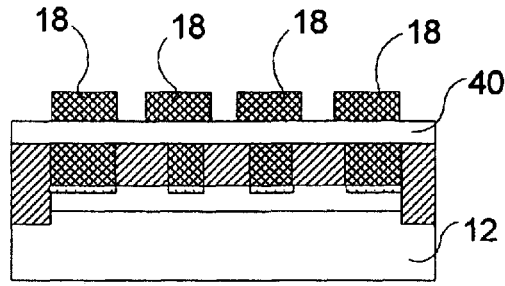

Referring now to FIGS. 9A and 9B, a layer of resistive memory material 40 is deposited over the bottom electrodes within the memory array area. The resistive memory material 40 is preferably a perovskite material, such as a colossal magnetoresistive (CMR) material or a high temperature superconducting (HTSC) material, for example $Pr_{0.7}Ca_{0.3}MnO_3$ (PCMO). Another example of a suitable material is $Gd_{0.7}Ca_{0.3}BaCo_2O_{5+5}$. The resistive memory material 40 is preferably between about 5 nm and 500 nm thick. The resistive memory material 40 can be deposited using any suitable deposition technique including pulsed laser deposition, rf-sputtering, e-beam evaporation, thermal evaporation, metal organic deposition, sol gel deposition, and metal organic chemical vapor deposition. The resistive memory material 40 is removed from outside the memory array area by ion milling or other suitable process thereby forming the active layer 16. It is also possible to form a large recessed area to deposit perovskite material over and then use chemical mechanical polishing (CMP) to form the active layer 16.

Top electrodes 18 are formed over the resistive memory material 40 forming the active layer 16 by depositing and patterning a layer of platinum, iridium, copper, silver, gold, or other suitable material. The top electrodes are preferably parallel to each other and preferably perpendicular to the n-type bit lines 14. The structures shown in FIGS. 9A and 9B correspond cross-sections of the top view shown in FIG. 1.

In one embodiment, the memory array structure is passivated and interconnected to supporting circuitry or other devices formed on the same substrate. It may also be possible to combine some of the steps discussed above, with those used to form the support circuitry.

The examples provided above all utilized n-type doped lines on a p-type substrate or p-well, with P+ dots to form the diodes. In this configuration the doped lines may act as the bit lines. However, the n-type lines may alternatively act as word lines by changing the polarity of the electrical signal used in connection with the memory array. It is also possible to construct a resistive memory array with the opposite polarity. The doped lines would be p-type lines, formed in an n-type substrate or n-well, with N+ dots to form the diodes. The p-type lines would either act as word lines or bit lines depending on the electrical polarity used in connection with the resistive memory array.

Although various exemplary embodiments have been described above, it should be understood that additional variations may be made within the scope of the invention, which is defined by the claims and their equivalents.

What is claimed is:

1. A method of manufacturing a memory structure comprising:
   a) providing a semiconductor substrate;
   b) creating a doped well having a depth to define the memory area;
   c) employing a shallow trench isolation process to divide the doped well into a plurality of doped lines isolated from each other;
   d) forming a plurality of diodes by forming doped regions of the opposite polarity in contact with regions of the plurality of doped lines;
   e) depositing a bottom electrode overlying each doped region;
   f) depositing a layer of perovskite material overlying the bottom electrode;
   g) removing the layer of perovskite material from regions outside a memory array area, whereby the layer of perovskite material remains within the memory array area; and
   h) forming a plurality of top electrodes overlying the layer of perovskite material.

2. The method of claim 1, wherein the doped well is doped n-type.

3. The method of claim 2, wherein the doped regions of the opposite polarity are p-type regions.

4. The method of claim 3, wherein the doped regions of the opposite polarity are formed by implanting boron ions.

5. The method of claim 4, wherein the boron ions are implanted at an energy of between approximately 5 keV and 15 keV and a dose of between approximately $1 \times 10^{15}/cm^2$ and $5 \times 10^{15}/cm^2$.

6. The method of claim 3, wherein the doped regions of the opposite polarity are formed by implanting $BF_2$ ions.

7. The method of claim 6, wherein the $BF_2$ ions are implanted at an energy of between approximately 40 keV an 80 keV and a dose of between approximately $1 \times 10^{15}/cm^2$ and $5 \times 10^{15}/cm^2$.

8. The method of claim 1, wherein employing a shallow trench isolation process further comprises: depositing and patterning an oxide layer and a polysilicon layer; etching the substrate to a depth deeper than the depth of the doped well; depositing silicon dioxide to fill the well; polishing the silicon dioxide; and removing polysilicon layer.

9. The method of claim 8, further comprising depositing and patterning a layer of silicon nitride in combination with the oxide layer and the polysilicon layer.

10. The method of claim 1, wherein bottom electrode material is platinum, iridium, or ruthenium.

11. The method of claim 1, wherein the perovskite material is a colossal magnetoresistance (CMR) material.

12. The method of claim 1, wherein the perovskite material is $Pr_{0.7}Ca_{0.3}MnO_3$(PCMO).

13. The method of claim 1, wherein the perovskite material is $Gd_{0.7}Ca_{0.3}BaCo_2O_{5+5}$.

14. The method of claim 1, wherein the top electrodes overly the doped lines forming a cross-point memory configuration.

* * * * *